United States Patent
Yang et al.

(10) Patent No.: US 6,749,484 B2
(45) Date of Patent: Jun. 15, 2004

(54) CHEMICAL MECHANICAL POLISHING (CMP) APPARATUS WITH TEMPERATURE CONTROL

(75) Inventors: Ming-Cheng Yang, Taipei (TW); Jiun-Fang Wang, Hsinchu (TW)

(73) Assignee: ProMOS Technologies Inc., Hsinchu (TW)

(*) Notice: Subject to any disclaimer, the term of this patent is extended or adjusted under 35 U.S.C. 154(b) by 0 days.

(21) Appl. No.: 10/145,717

(22) Filed: May 16, 2002

(65) Prior Publication Data

US 2003/0114077 A1 Jun. 19, 2003

(30) Foreign Application Priority Data

Dec. 14, 2001 (TW) .......................... 90131137 A

(51) Int. Cl.⁷ .................................. B24B 1/00
(52) U.S. Cl. ...................... 451/7; 451/53; 451/286; 451/398
(58) Field of Search ................ 451/7, 36, 53, 451/41, 398, 286, 285, 287, 288, 289, 394

(56) References Cited

U.S. PATENT DOCUMENTS

| | | | |
|---|---|---|---|
| 4,432,253 A | * 2/1984 | Kerlin | 74/573 R |
| 5,196,353 A | 3/1993 | Sandhu et al. | |
| 5,605,488 A | * 2/1997 | Ohashi et al. | 451/7 |
| 5,873,769 A | 2/1999 | Chiou et al. | |
| 5,941,758 A | 8/1999 | Mack | |
| 6,020,262 A | * 2/2000 | Wise et al. | 438/691 |
| 6,033,987 A | 3/2000 | Lin et al. | |
| 6,120,347 A | * 9/2000 | Sandhu et al. | 451/5 |
| 6,227,939 B1 | 5/2001 | Monroe | |
| 6,261,151 B1 | 7/2001 | Sandhu et al. | |
| 6,343,784 B1 | * 2/2002 | Jourde et al. | 269/287 |

* cited by examiner

*Primary Examiner*—Hadi Shakeri
(74) *Attorney, Agent, or Firm*—Birch, Stewart, Kolasch & Birch, LLP

(57) ABSTRACT

A chemical mechanical polishing (CMP) apparatus with temperature control. The apparatus controls circular zone temperature of the wafer. The CMP apparatus comprises a platen; a carrier holding a wafer against the platen; a guide ring disposed at the rim of the carrier to mount the wafer on the carrier; and a heater disposed in the guide ring, in the carrier, or used to heat the slurry. The temperature of the heater is set between 20° C. and 60° C. Thus, the polishing rate at the edge is improved, and the polishing difference between the edge and the center of the wafer is reduced.

6 Claims, 3 Drawing Sheets

CHEMICAL MECHANICAL POLISHING (CMP) APPARATUS WITH TEMPERATURE CONTROL

BACKGROUND OF THE INVENTION

1. Field of the Invention

This invention relates to a chemical mechanical polishing (CMP) apparatus. In particular, the present invention relates to a CMP apparatus with temperature control for improving polishing uniformity.

2. Description of the Related Art

The CMP process is a technique frequently for planarizing the surfaces of insulating film and conductive film on a semiconductor substrate or filling a conductive film only in trenches or grooves.

A wafer carrier is used in the CMP apparatus to hold the wafer with the guide ring, and prevent the wafer from slipping. The wafer faces the polishing pad dispersed with polishing slurry. The polishing pad is supported by a rotatable platen.

In general, a CMP process involves mechanically polishing a thin, flat semiconductor wafer by holding and rotating the wafer against a polishing platen under controlled parameters, such as rotational speed, down force, pressure, temperature, time, and chemical conditions. However, these parameters cannot reduce polishing difference between the center and edge of the wafer, especially problematic, since, after polishing, the edge of the wafer has higher topography. In order to resolve this problem, multiple pressure zones are provided to enhance the polishing efficiency at the edge to improve the uniformity of the wafer, in cases such as U.S. Pat. No. 5,941,758 (Mack) and U.S. Pat. No. 6,033,987 (Lin et al.). However, the pressure from center to edge is not continuous, and the whole polishing uniformity cannot be efficiently resolved.

Recently, temperature parameters have been used to control the CMP process, such as in U.S. Pat. Nos. 5,196,353, 6,120,347, 6,261,151 taught by Sandhu, including the steps of chemically mechanically planarizing a wafer while simultaneously detecting a temperature of the wafer to develop a thermal image which can be analyzed to control the (CMP) process parameters. In addition to use in developing a thermal image of the wafer developed during the (CMP) process, such temperature differentials can be used to detect planar end points on the wafer.

In U.S. Pat. No. 6,227,939, Monroe adjusts the temperature of the wafer carrier and the platen to improve the uniformity of the wafer.

In U.S. Pat. No. 5,873,769, Chiou adjusts the temperature of the circular segments of the wafer carrier and the platen to improve the uniformity of the wafer.

SUMMARY OF THE INVENTION

The object of the present invention is to provide a CMP apparatus with temperature control to improve the uniformity of the wafer.

To achieve the above-mentioned object, a CMP apparatus with temperature control is provided in the present invention.

According to a first aspect of the invention, the CMP apparatus comprising: a platen; a carrier holding a wafer against the platen; a guide ring disposed at the rim of the carrier to mount the wafer thereon; and a heater disposed in the guide ring to heat the edge of the wafer. The temperature of the heater is set between 20° C. and 60° C.

According to a second aspect of the invention, the CMP apparatus comprising: a platen; a carrier holding a wafer against the platen; a guide ring disposed at the rim of the carrier to mount the wafer at the carrier; and a heater disposed in the carrier to increase the temperature from center to edge. The temperature of the heater is set between 20° C. and 60° C.

According to a third aspect of the invention, the CMP apparatus comprising: a platen; a polishing pad on the platen; a slurry supplied to the polishing pad; a carrier holding a wafer against the platen and contacting the polishing pad; and a heater for heating the slurry, wherein the temperature of the slurry increases from center to edge of the wafer. The temperature of the heater is set between 20° C. and 60° C.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE PREFERRED EMBODIMENT

In order to improve the polishing uniformity, a chemical mechanical polishing (CMP) apparatus with control of temperature and other general factors, such as down force, carrier/platen rotary rate and chemical component concentrations of the slurry is provided.

First Embodiment

Figure 1:
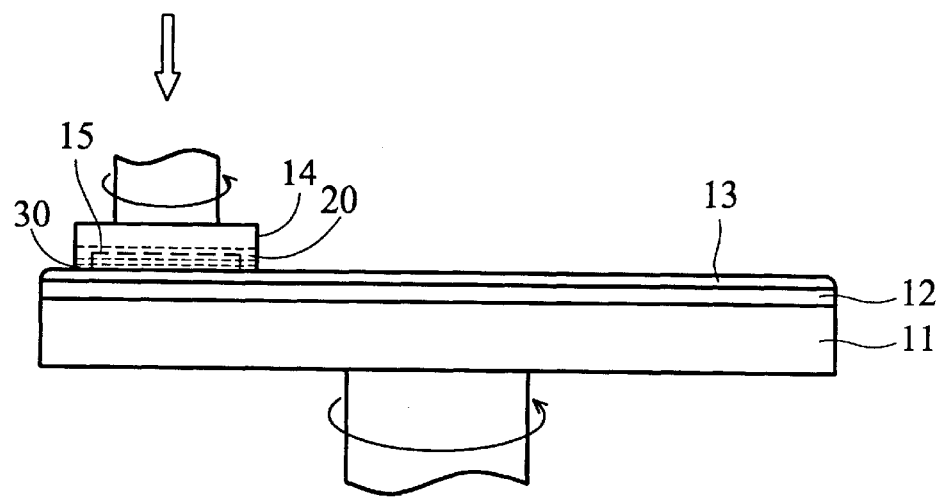
FIG. 1 is a side view of a CMP apparatus according to the first embodiment of the present invention.

FIG. 1 is a side view of a CMP apparatus according to the first embodiment of the present invention.

The carrier 14 holds the wafer 15 to be polished and presses the wafer 15 against the platen 11 with a preset pressure so as to permit the slurry 13 to be held between the surface of the polishing pad 12 and the wafer 15. The slurry 13 is applied to the polishing pad 12 to proceed CMP. The guide ring 20 is disposed at the rim of the carrier 14 to mount the wafer 15 on the carrier 14. The heater 30 is disposed in the guide ring 20 to heat the edge of the wafer 15. Therefore, the polishing rate at the edge is improved, and the polishing difference between the edge and the center of the wafer 15 is reduced. The temperature of the heater 30 is set between 20° C. and 60° C.

Figure 2:
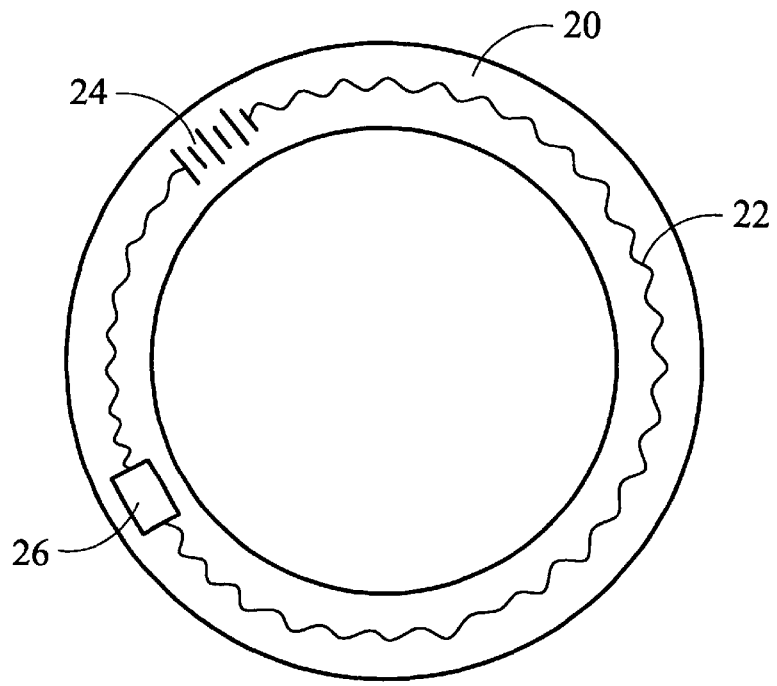
FIG. 2 is a top view of the guide ring in the FIG. 1.

FIG. 2 is a top view of the guide ring 20, and the heater 30 in the guide ring 20 is composed of a coil 22, a power supply 24 and a temperature sensor 26. The power supply 24 is, for example, battery, and the coil 22 is, for example, a piezo-electric coil. The coil 22 connects to two terminals of the power supply 24 to produce thermal energy to heat the edge of the wafer 15. The temperature sensor 26, for example, is a positive temperature coefficient thermistor (PTC thermistor), and inserted into the coil 22 to detect and modulate the temperature of the coil 22 to maintain at a predetermined temperature.

Second Embodiment

Figure 3:
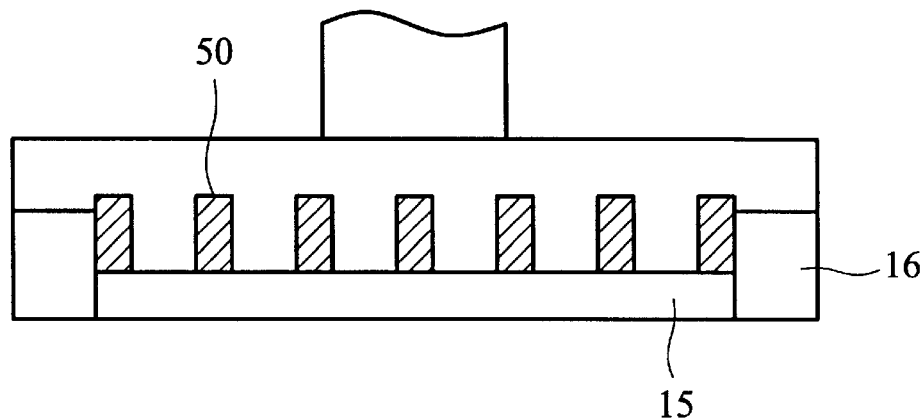
FIG. 3 is a cross section of a carrier according to the second embodiment of the present invention.

FIG. 3 is a cross section of a carrier according to the second embodiment of the present invention.

The carrier 40 carries the wafer 15 to be polished and presses the wafer 15 against the platen 11 with a preset pressure so as to permit the slurry 13 to be held between the surface of the polishing pad 12 and the wafer 15. The slurry 13 is applied to the polishing pad 12 to proceed CMP. The guide ring 16 is disposed at the rim of the carrier 40 to mount the wafer 15 at the carrier 40. The heater 50 is disposed in the carrier 40 to make the temperature zones increase from center to edge of the wafer 15. Therefore, the polishing rate at the edge is improved, and the polishing difference between the edge and the center of the wafer 15 is reduced. The temperature of the heater 50 is set between 20° C. and 60° C.

Figure 4:
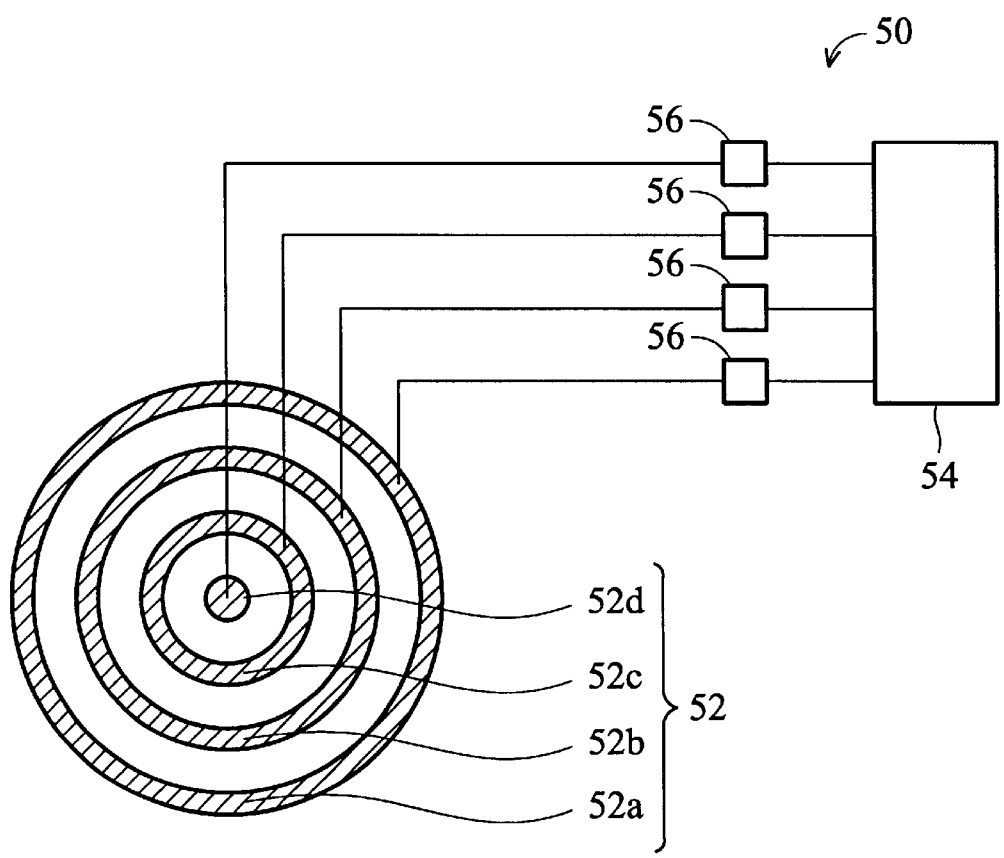
FIG. 4 is a bottom view of the carrier in the FIG. 3.

FIG. 4 is a bottom view of the carrier 40, and the heater 50 in the carrier 40 is a multiple circular heating zone device composed of coils 52, a heater/chiller unit 54 and temperature sensors 56. The coils 52 are, for example, piezo-electric coils. Each circular coil 52 controls the temperature of its corresponding circular zones of the wafer 15. The temperature sensors 56 are, for example, thermocouple devices and inserted into each independent coil 52 and the heater/chiller unit 54 to detect the temperature of each coil 52. The heater/chiller unit 54 and the temperature sensors 56 provide suit feedback and temperature modulation to maintain the coils 52 at a predetermined temperature.

The coils 52 are concentric, independent coils 52a, 52b, 52c and 52d controlling temperature of each circular zone of the wafer 15. The temperature is increased from center to edge of the wafer 15, for example, the temperature of the coils 52 is $52a > 52b > 52c > 52d$. Therefore, the polishing rate at the edge is improved, and the polishing difference between the edge and the center of the wafer 15 is reduced. A wafer with uniform surface is obtained after polishing.

Third Embodiment

Figure 5:
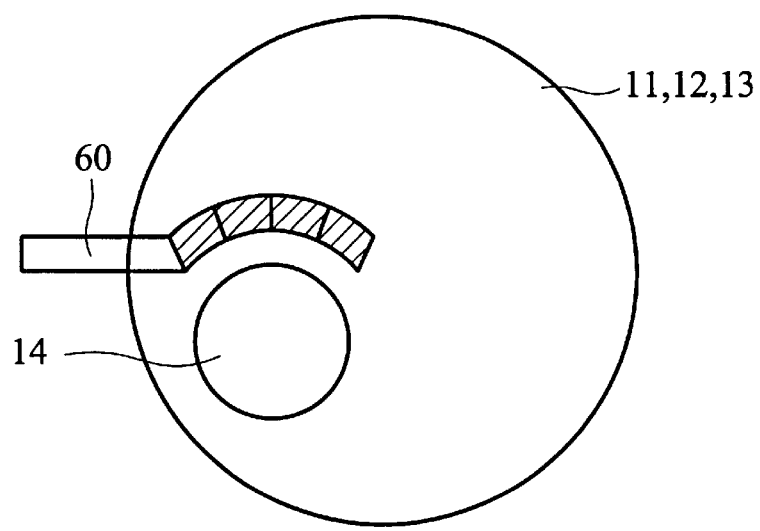
FIGS. 5 and 6 are top views of CMP apparatuses according to the third embodiment of the present invention.

FIG. 5 is a top view of a CMP apparatus according to the third embodiment of the present invention.

The carrier 14 carries the wafer 15 to be polished and presses the wafer 15 against the platen 11 with a preset pressure so as to permit the slurry 13 to be held between the surface of the polishing pad 12 and the wafer 15. The slurry 13 is applied to the polishing pad 12 to proceed CMP. The CMP apparatus further comprises a heater 60 having multiple heating zones (shown as the slash regions in FIG. 6) to heat the slurry 13 so that the temperature of the slurry 13 is increased from center to edge corresponding to the position of the water through proper temperature adjustments of each heating zone in the heater 60. The heater 60 is independent to and in front of the wafer carrier 14. Therefore, the polishing rate at the edge is improved, and the polishing difference between the edge and the center of the wafer 15 is reduced. The temperature of the heater 30 is set between 20° C. and 60° C.

Figure 6:
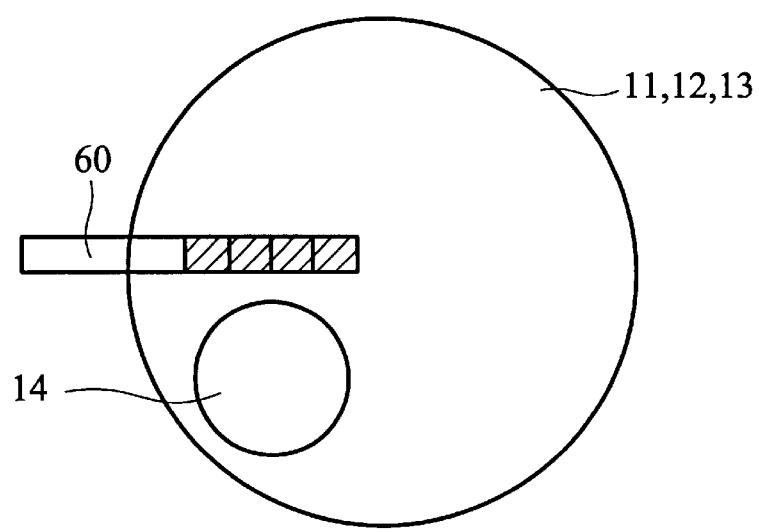

The heater 60 can be arced, having the same radian as the wafer 15, as shown in FIG. 5, or linear, as shown in FIG. 6.

The arc heater 60, as shown in FIG. 5, has better thermal exchange effect because it has the same radian as the wafer 15. However, the linear heater 60, as shown in FIG. 6 has the advantage of easy fabrication. No matter which type of heater 60, any model of CMP apparatus is suitable.

The above-mentioned heaters 30, 50 and 60 as described in the first, second and third embodiments, can be combined with each other.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A chemical mechanical polishing (CMP) apparatus with temperature control, comprising:

a platen;

a carrier holding a wafer against the platen;

a guide ring disposed at the rim of the carrier to mount the wafer on the carrier; and a heater disposed in the guide ring to heat the edge of the wafer, wherein the heater comprises a temperature sensor, a power supply and a coil connecting to two terminals of the power supply, and the temperature sensor is inserted into the coil.

2. The CMP apparatus as claimed in claim 1, wherein the temperature of the heater is set between 20° C. and 60° C.

3. A chemical mechanical polishing (CMP) apparatus with temperature control, comprising:

a platen;

a polishing pad on the platen;

a slurry supplied to the polishing pad;

a carrier holding a wafer against the platen and contact the polishing pad; and a heater for heating the slurry, such that the temperature of the slurry is increase from center to edge corresponding to the position of the wafer, wherein the heater is independent to and in front of the carrier.

4. The CMP apparatus as claimed in claim 3, wherein the temperature of the heater is set between 20° C. and 60° C.

5. The CMP apparatus as claimed in claim 3, wherein the heater is arced.

6. The CMP apparatus as claimed in claim 3, wherein the heater is linear.

* * * * *